United States Patent [19]

Morata

[11] Patent Number: 4,763,308
[45] Date of Patent: Aug. 9, 1988

[54] BATTERY HOUSING FOR AN ELECTRONIC WATCH

[75] Inventor: Philippe Morata, Bienne, Switzerland

[73] Assignee: ETA SA Fabriques d'Ebauches, Granges, Switzerland

[21] Appl. No.: 878,544

[22] Filed: Jun. 25, 1986

[30] Foreign Application Priority Data

Jun. 25, 1985 [CH] Switzerland ............... 2708/85

[51] Int. Cl.[4] .................. G04B 37/00; G04B 1/00
[52] U.S. Cl. .................................... 368/88; 368/204
[58] Field of Search ............... 368/88, 204, 276, 299, 368/300

[56] References Cited

U.S. PATENT DOCUMENTS

| 4,165,607 | 8/1979 | Fedorowigz et al. | 368/88 |
| 4,201,040 | 5/1980 | Nakayama | 368/204 |
| 4,223,521 | 9/1980 | Saitoh et al. | 368/204 |
| 4,251,604 | 2/1981 | Umemoto | 368/204 X |
| 4,362,396 | 12/1982 | Perrot | 368/88 |
| 4,392,748 | 7/1983 | Yoshino | 368/88 |
| 4,430,009 | 3/1980 | Muller | 368/203 |
| 4,460,281 | 7/1984 | Othenin-Girard | 368/88 |

FOREIGN PATENT DOCUMENTS

| 0024364 | 4/1981 | European Pat. Off. |
| 634195 | 1/1983 | Switzerland . |
| 2020861 | 11/1979 | United Kingdom . |
| 1566695 | 5/1980 | United Kingdom . |
| 2112562 | 7/1983 | United Kingdom . |

Primary Examiner—Vit W. Miska
Attorney, Agent, or Firm—Griffin, Branigan, & Butler

[57] ABSTRACT

A battery housing comprises a hole entirely piercing the watch base plate and a cover closing the hole. Such cover is secured to the hole by fastening means which comprises in one form a flange projecting into the hole. In the cover moreover a tongue is raised which serves as a mechanical support to one face of the battery and, via a printed circuit arranged between the cover and the battery, the electrical contacting of the battery electrode forming part of said face.

8 Claims, 2 Drawing Sheets

BATTERY HOUSING FOR AN ELECTRONIC WATCH

This invention concerns a battery housing for electronic watches of the type including a base plate located between a back cover and a dial, a printed circuit comprising a substrate and at least one conductive track, said housing including a hole entirely piercing said base plate.

BACKGROUND OF THE INVENTION

Swiss Pat. No. 632.895 corresponding to U.S. Pat. No. 4,430,009 discloses an arrangement, wherein a battery is maintained on the base plate by a clamp screwed on at its ends and located on the back cover side of the watch. There is inserted between the electrode of the battery and the clamp a printed circuit which includes a conductive track in contact with the electrode. The battery is housed in a hole which completely pierces the base plate, the rim of this hole on the dial side being provided with a flange in the form of a bevel projecting into the hole. In this arrangement the edge of the battery rests on the bevelled flange.

Such an arrangement enables reduction of the height required by the battery housing and presents an advantage over the proposal shown for instance in British Pat. No. 1.408.610. In this latter, effectively, the battery is housed in a hole provided in the base plate, the bottom of the hole being constituted by a wall forming part of said base plate. It is known that in order to be practically realizable, this bottom must have a thickness of at least 0.15 to 0.20 mm. There results therefrom a prohibitive space requirement in the sense of the thickness of the watch, particularly where watches of the so-called extra-thin variety are concerned.

The first of the cited documents presents however several disadvantages. Initially, the construction as proposed is poorly adapted to the extreme tolerances which are found in the diameter of the battery. If this diameter is small, there is a risk that the battery will not come to rest on the bevelled flange, but directly on the watch dial. Thence, if the battery should be introduced in the inverted sense, there is a substantial probability that its electrode will come into contact with the dial, thus creating via the base plate a short-circuit at the terminals of the battery. Finally, the clamp as proposed fixed by means of two screws to the base plate, does not permit absorbing the considerable differences which are met with in the thickness even of the batteries capable of being employed.

SUMMARY OF THE INVENTION

The present invention enables overcoming the cited disadvantages while respecting the same conditions of small space requirements in height. In order to do so, it proposes a battery housing for an electronic watch of the type including a base plate located between a back cover and a dial, a printed circuit comprising an insulating substrate and at least one conductive track, said housing including a hole entirely piercing said base plate and comprising fastening means on one of the rims of the hole on which a cover is secured, a tongue being raised in said cover to serve as a support to one face of the battery, the electrical contact with said face being obtained by the printed circuit inserted between said tongue and said battery.

DESCRIPTION OF THE PREFERRED EMBODIMENT

Figure 1:
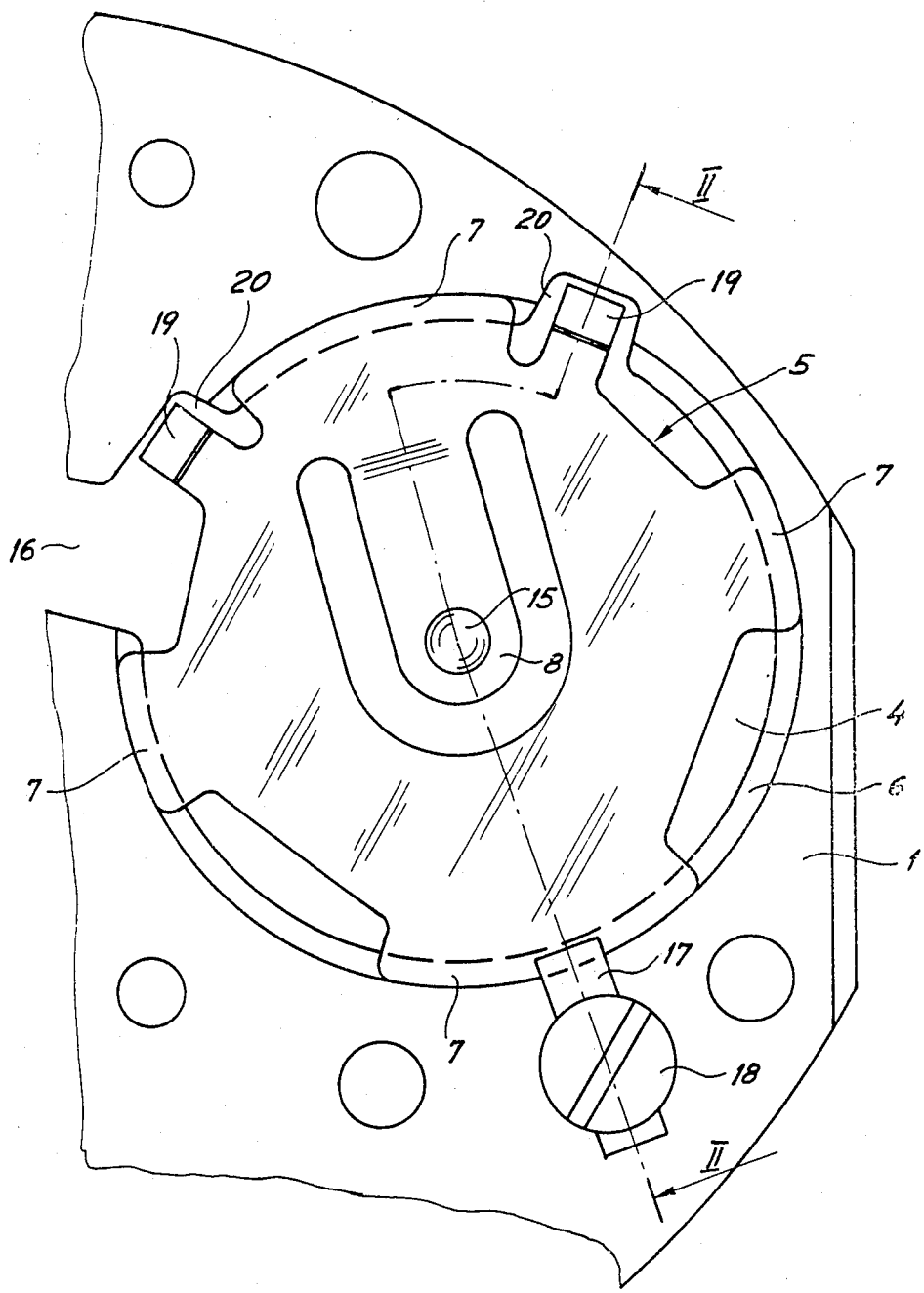
FIG. 1 is a top view of the battery housing according to the invention and following a first form of execution thereof.
Figure 2:
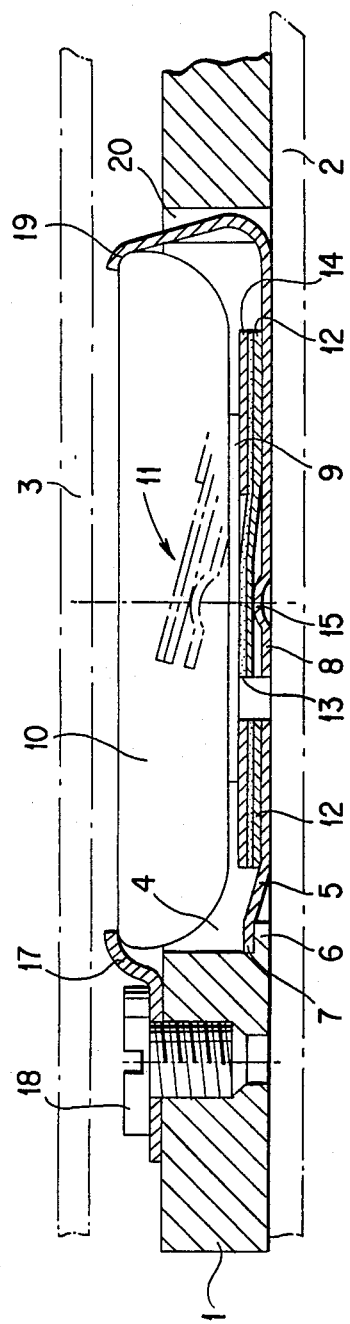
FIG. 2 is a cross-section along line 2—2 of FIG. 1.

FIGS. 1 and 2 provide a first mode of execution of the battery housing in accordance with the invention. The watch which is partially represented therein comprises a base plate 1 located between a dial 2 and a back cover 3. In the base plate 1 is provided a hole 4 which completely pierces it. The diameter of this hole is slightly greater than the maximum diameter of the battery which it is desired to house therein. In accordance with the invention, one of the rims of the hole is provided with fastening means on which a cover 5 is fitted. As may be seen particularly on FIG. 2, one of the modes of execution of the invention consists of providing a flange 6 at the rim of the hole located on the dial side 2 projecting into the hole 4. This flange serves as a support for cover 5 which is introduced into the hole from the side of back cover 3. The cover 5 may bear on said flange over its entire circumference but may also as shown on FIG. 1 rest only at certain places as referenced by 7. To gain space in height, the support areas 7 are raised relative to the cover which has as result that the thickness of the cover 5 is comprised in the thickness of the flange 6.

According to an important characteristic of the invention, a tongue 8 is raised in cover 5. This tongue bears on a face 9 of battery 10 when the battery is introduced into the housing. The battery is thus urged upwardly held as it is by clamps which will be discussed further on and by the back cover 3 of the watch. The face 9 of the battery is the electrode opposed to the ground electrode, this latter being in elastic contact with the base plate, the clamps and the back cover.

As may be seen on FIG. 2, a printed circuit 11 comprising an insulating substrate 12 and at least one conductive track 13 is interposed between the tongue 8 and the battery 10. The conductive track is further covered by an insulating layer 14 which prevents said track from coming into contact with the ground electrode of the battery. The materials employed for obtaining the printed circuit are of very small thickness. One may employ for the substrate an insulating sheet of material sold under the registered trademark "Kapton" and for the protection layer a sheet of material sold under the trademark "Ryston". In this construction, the conductive track (generally of gilded copper) is bared at the end of the tongue 8, that is to say at the place where the center of the electrode 9 of battery 10 is applied. To improve the electrical contact, FIG. 2 shows that there has been raised a blister 15 in tongue 8 which enables assurance of a precise point contact of the conductive track 13 on electrode 9 of the battery. The tongue 8 and the printed circuit 11 have been shown on FIG. 2 in full lines, in the case where the battery is present in its housing and in broken lines in the case where said battery has been removed. The thicknesses of the layers comprising the printed circuit have been heavily exaggerated to facilitate reading the drawing.

To avoid encumbering FIG. 1 with details which are not necessary for understanding the invention, neither the battery 10 nor the printed circuit 11 have been shown. This top view shows the battery housing formed of hole 4 pierced in the base plate 1 and of cover 5 placed at the bottom of the hole. FIG. 1 shows a channel 16 pierced in the base plate and ending up in hole 4. The printed circuit assuring contact with the battery is coupled to the other electrical elements of the watch by an isthmus passing by channel 16. Here there is found a construction analogous to that which is the object of Swiss Pat. No. 632.895 equivalent to U.S. Pat. No. 4,430,009 cited hereinabove and to which reference may be had for further details of this part of the construction.

As may be seen further on FIGS. 1 and 2, the battery, once introduced into its housing, is retained in the sense of its thickness by a stirrup 17 fixed onto base plate 1 by means of a screw 18. According to a mode of execution suitable for this invention, the battery is likewise laterally retained in its housing by two supplementary clamps 19 which are integrally formed with the cover and which rise through the hole at the periphery thereof. To allow these clamps some elastic play, the base plate provides openings 20 in which said clamps are housed. The figures show that these clamps are obtained directly during the stamping and bending operations of the cover 5. They are employed for maintaining the battery in place in the movement, particularly when the bottom cover of the watch has not yet been fixed into place, i.e. during the handling of the bare movement. In addition to their mechanical function, they assure electrical grounding of the ground electrode of the battery.

Figure 3:
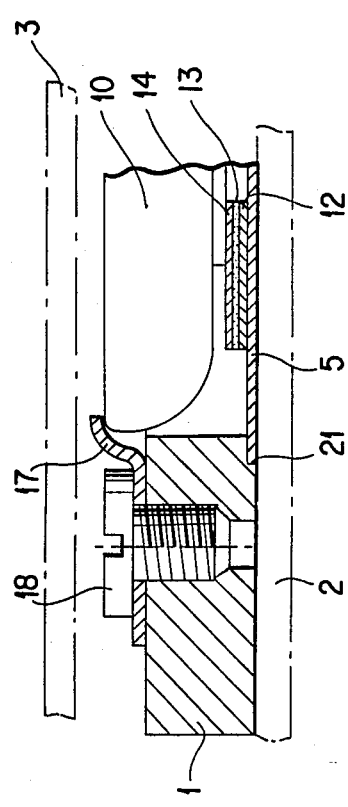
FIG. 3 is a cross-section showing a second mode of execution of the invention.

FIG. 3 is a cross-sectional drawing showing a second form of execution of the invention. In this execution the rim of the hole located at the dial side 2 is provided with an annular undercut 21 in which is fastened the cover 5. Except for this different manner of fitting the cover to the base plate, the other characters as described hereinabove remain the same, namely the tongue, the lateral fastening clamps, etc.

Different procedures may be employed for fitting the cover 5 to fastening means arranged at the rim of the hole. The cover may be welded or glued or even set onto its support.

If one now returns to FIG. 2, the advantages brought about by this invention will be understood. It will be noted in effect that the battery housing may accommodate batteries the thickness of which is included in large tolerances without there being a necessity to change cover 5. In the case where the battery is of small thickness, the clamp 19 will bear on the upper rounded portion of the battery as shown on the drawing. In the case where this thickness is greater, the same clamp will bear on the lateral side of said battery. It will likewise be seen that there cannot be a short-circuit if the battery is introduced upside down, at least as long as the back cover 3 is not placed on the watch case. Finally, the absence of bevelled edges as was the case of the construction described in the introduction to the present description enables employing batteries of diameters having large tolerances, the pole of electrode 9 resting always on the cover, this assuring a space requirement of constant height.

It will be noted that the proposed construction takes very little space in the thickness of the base plate. The cover in effect is realized in thin material (about 0.08 mm) which is advantageous relative to the arrangement where the bottom of the battery housing forms an integral part of the base plate. Since this cover is realized in elastic material (beryllium bronze for instance), one may take advantage thereof in raising the support tongue of the battery. This cover in fact has a double function: that of providing a mechanical support for the battery and that of assuring an electrical contact with the electrode of the battery by the interposition of the printed circuit.

What I claim is:

1. A battery housing for an electronic watch of the type including a base plate (1) located between a back cover (3) and a dial (2), a printed circuit (11) comprising an insulating substrate (12) and at least one conductive track (13), said housing including a hole (4) entirely piercing said base plate, a cover (5) to block said hole at the dial side of said base plate, said cover comprising support areas (7) distributed over its periphery, a fastening means (6, 21) provided on the rim of said hole nearest said dial, and cooperating with said support areas to hold said cover, a tongue being raised in said cover to serve as a support to one face (9) of a battery, within said hole, the electrical contact with said face being obtained by the printed circuit inserted between said tongue and said battery.

2. A battery housing as set forth in claim 1 wherein the rim of the hole located on the dial side is provided with a flange projecting into the hole, said flange serving as fastening means for the cover onto the housing.

3. A battery housing as set forth in claim 1 wherein the rim of the hole located on the dial side is provided with an annular undercut in which the cover is fastened.

4. A battery housing as set forth in claim 1 wherein the cover is welded onto the fastening means located at the rim of the hole.

5. A battery housing as set forth in claim 1 wherein the cover is set onto the fastening means located at the rim of the hole.

6. A battery housing as set forth in claim 1 wherein the cover is glued onto the fastening means located at the rim of the hole.

7. A battery housing as set forth in claim 1 wherein the cover further comprises at least one clamp rising through the hole at the periphery thereof for retaining the battery laterally.

8. A battery housing as set forth in claim 1 wherein the cover is formed from an elastic material.

* * * * *